(12) United States Patent
Ly et al.

(10) Patent No.: US 8,321,491 B2
(45) Date of Patent: Nov. 27, 2012

(54) SYSTEM AND METHOD FOR DETECTING A WEAK SIGNAL IN A NOISY ENVIRONMENT

(75) Inventors: Canh Ly, Laurel, MD (US); Edward W. Burke, Laytonsville, MD (US); Ronald J. Wellman, Silver Spring, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 1554 days.

(21) Appl. No.: 11/819,227

(22) Filed: Jun. 26, 2007

(65) Prior Publication Data

US 2009/0006016 A1  Jan. 1, 2009

(51) Int. Cl.
*G06F 17/10* (2006.01)
(52) U.S. Cl. ..................................................... 708/312
(58) Field of Classification Search ................ None
See application file for complete search history.

(56) References Cited

U.S. PATENT DOCUMENTS

| | | | |
|---|---|---|---|
| 5,092,341 A | 3/1992 | Kelen | |
| 5,109,862 A | 5/1992 | Kelen et al. | |
| 5,632,003 A | 5/1997 | Davidson et al. | |
| 5,813,993 A | 9/1998 | Kaplan et al. | |
| 6,243,414 B1 | 6/2001 | Drucker et al. | |
| 7,023,938 B1 * | 4/2006 | Kapoor et al. | 375/350 |
| 7,053,815 B1 | 5/2006 | Joynson et al. | |
| 7,158,723 B2 | 1/2007 | Wan et al. | |
| 7,173,966 B2 | 2/2007 | Miller | |
| 2009/0006016 A1 * | 1/2009 | Ly et al. | 702/77 |

* cited by examiner

*Primary Examiner* — David H Malzahn
(74) *Attorney, Agent, or Firm* — Edward L. Stolarun; John Hugh Raubitschek

(57) ABSTRACT

Systems and methods are disclosed for computing a power spectral density of a signal. One such method computes a Fast Fourier Transform (FFT) of a first signal segment and an FFT of a second signal segment. The first and second segments are adjacent and non-overlapping in time, and the second segment follows the first. The first FFT is multiplied by a complex conjugate of the second FFT. A first complex value is computed from this first product. An FFT of a third signal segment is computed. The second and third segments are adjacent and non-overlapping in time. The third segment follows the second segment. The second FFT is multiplied by a complex conjugate of the third FFT. A second complex value is computed from this second product. The first and second complex values are added, and the power spectral density of the sum is computed.

5 Claims, 3 Drawing Sheets

SYSTEM AND METHOD FOR DETECTING A WEAK SIGNAL IN A NOISY ENVIRONMENT

GOVERNMENT INTEREST

The invention described herein may be manufactured, used, and licensed by or for the United States Government.

CROSS REFERENCE TO RELATED APPLICATIONS

Not applicable.

FIELD OF THE INVENTION

The present invention relates to digital signal processing, and more specifically, to a system and method for detecting a weak signal in noisy environment.

BACKGROUND

A variety of digital signal processing algorithms are used for detecting the presence of an expected signal within a received noisy signal. When the expected signal is a single tone (pure sine wave at a particular frequency), the power spectral density (PSD) algorithm is commonly used. The presence of a single tone is revealed by a single spike in PSD at the tone frequency when PSD is plotted versus frequency.

The probability of detection depends on the signal-to-noise ratio (SNR) of the received signal, with the typical probability of tone detection dropping rapidly when SNR drops below −10 dB. Therefore, improvements to tone detection are desirable.

SUMMARY

Systems and methods are disclosed for computing a power spectral density of a signal. One such method computes a Fast Fourier Transform (FFT) of a first signal segment and an FFT of a second signal segment. The first and second segments are adjacent and non-overlapping in time, and the second segment follows the first. The first FFT is multiplied by a complex conjugate of the second FFT. A first complex value is computed from this first product. An FFT of a third signal segment is computed. The second and third segments are adjacent and non-overlapping in time. The third segment follows the second segment. The second FFT is multiplied by a complex conjugate of the third FFT. A second complex value is computed from this second product. The first and second complex values are added, and the power spectral density of the sum is computed.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention.

DETAILED DESCRIPTION

The systems and/or methods for detecting a weak signal in noisy environment described herein can be implemented in software, hardware, or a combination thereof. In some embodiments, the system and/or method is implemented in software that is stored in a memory and that is executed by a suitable microprocessor (uP) situated in a desktop computer or workstation computer. However, system and/or method, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
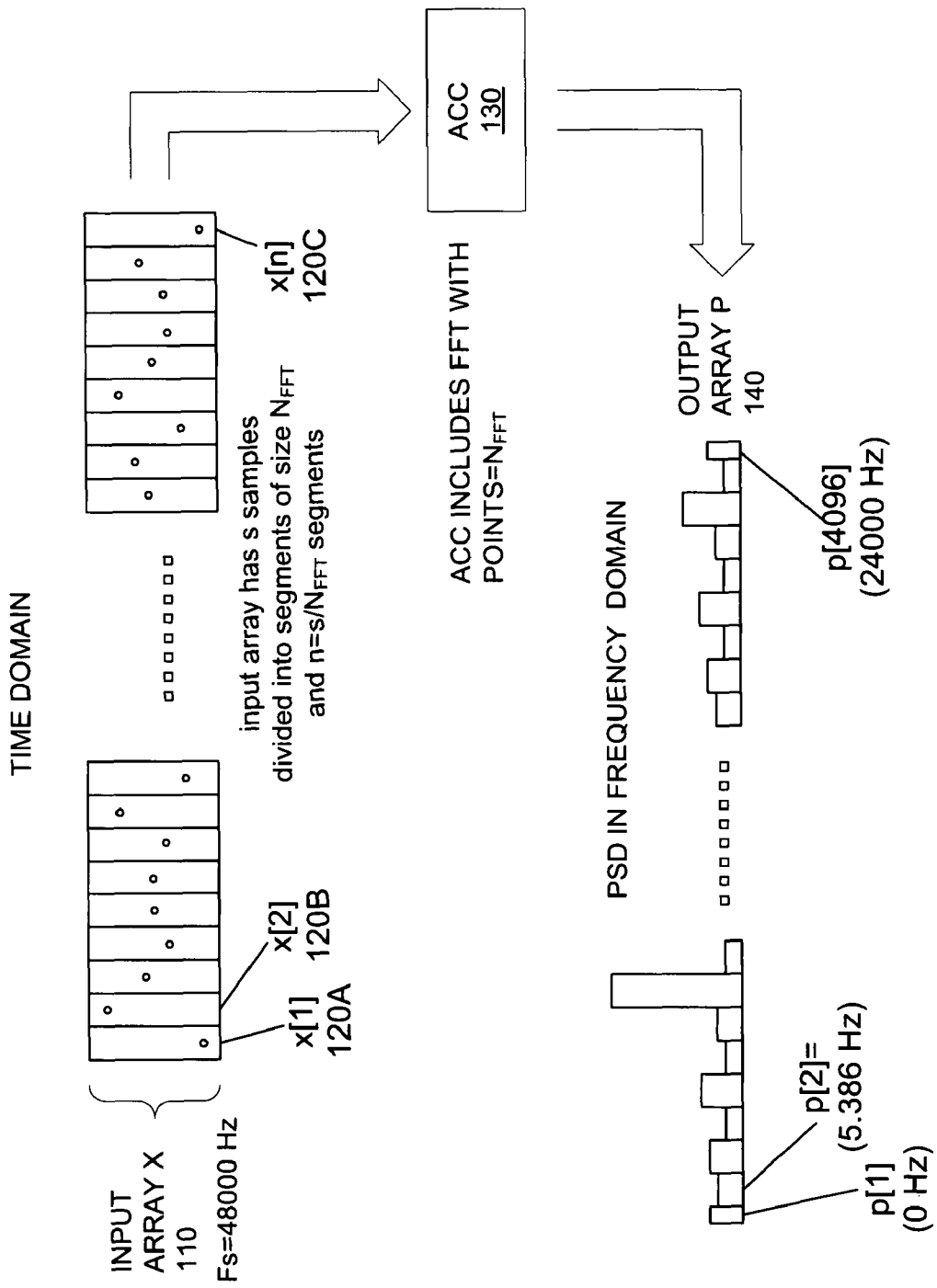
FIG. 1 is a high level block diagram of one embodiment of the system and method for detecting a weak signal in noisy environment.

FIG. 1 is a high level block diagram of one embodiment of the system and method for detecting a weak signal in noisy environment. A signal is stored as a series of time domain samples in input array x (110), where the samples are for a particular sample frequency $F_s$. Although composed of individual samples, the algorithm described herein partitions the samples into groups ("segments") of size $N_{FFT}$. In FIG. 1, $N_{FFT}$ is 8192. The number of groups is a variable n, which depends on the total number of samples (n=total samples/$N_{FFT}$). The input array x (110) in FIG. 1 has n segments: segment x[1] (120A), segment x[2] (120B), etc., up to the last segment x[n] (120C).

An algorithm called adjacent conjugate convolution (ACC) 130 is performed on array x (110) to produce a power spectral density (PSD) array p (140). The ACC algorithm 130 computes the Fast Fourier Transform (FFT) of array x (110) using an FFT with $N_{FFT}$ points. The ACC algorithm 130 will be described in more detail in connection with FIG. 2.

In an embodiment disclosed herein, each sample (120A, 120B, 120C) in x is a real number. Techniques for converting between real number and complex number representations of signals are well-understood by persons of ordinary skill in the art of digital signal processing and such persons will understand how the techniques disclosed herein can be adapted to signals that are represented with complex numbers.

PSD describes relative power as a function of frequency, and the PSD array 140 is indexed by frequency. The frequencies range from 0 to $F_s/2$, and are spaced $F_s/N_{FFT}$ apart. In the example of FIG. 1, the sample frequency $F_s$ is 48000, so frequencies range from 0 to 48000/2=24000 Hz. The frequencies are spaced every 24000/4096=5.386 Hz. Thus, the value of p[1] is the power at 0 Hz, p[2] is the power at 5.386 Hz, and the value of p[4096] is the power at 24000 Hz. As will be described later, the PSD in array p (140) has improved gain compared to a conventional PSD calculation because the ACC algorithm 130 divides the input array x (110) into multiple segments, and coherently integrates uncorrelated noise from adjacent segments.

Figure 2:
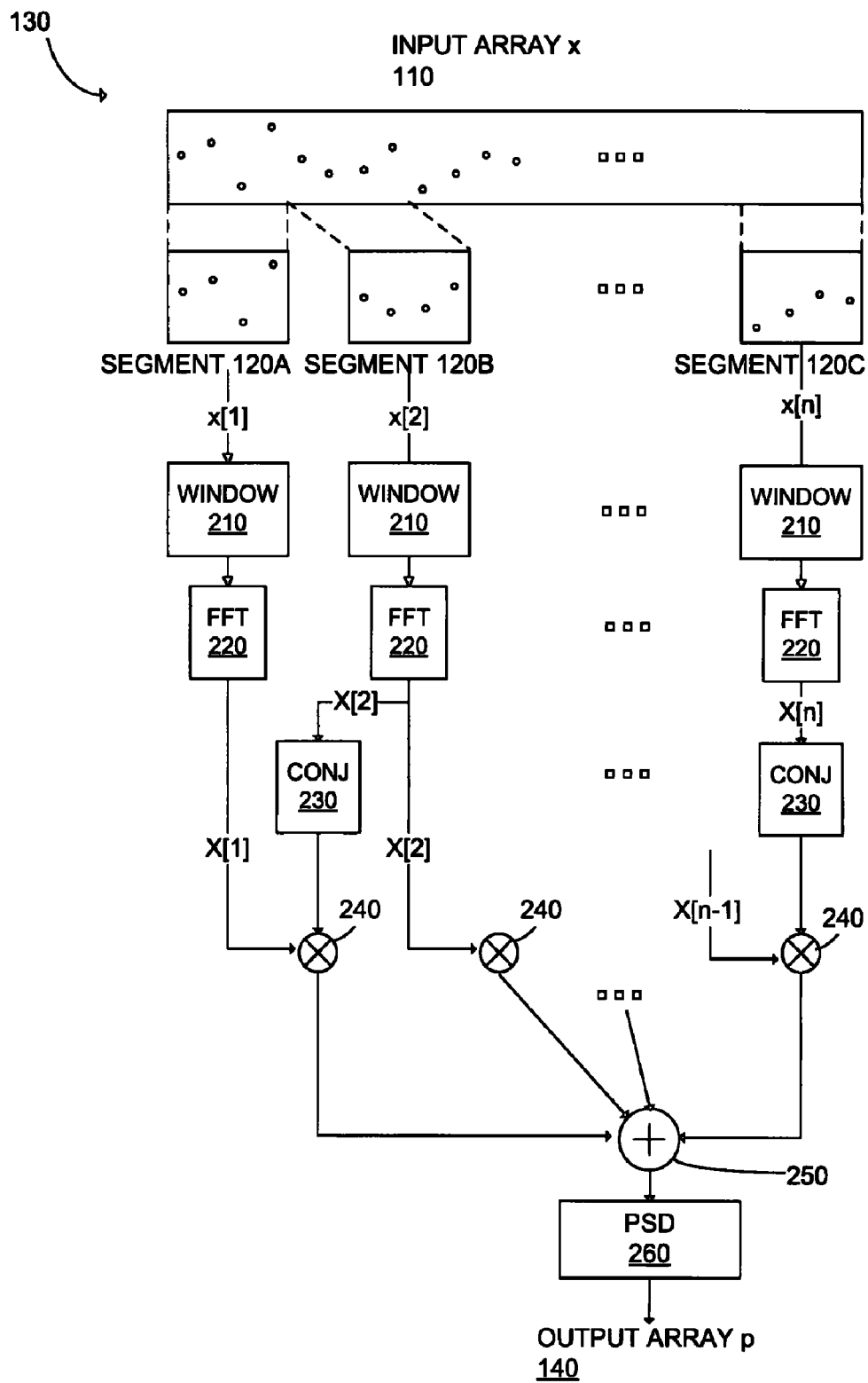
FIG. 2 is a data flow diagram of the ACC algorithm 130 of FIG. 1.

FIG. 2 is a data flow diagram of the ACC algorithm 130 of FIG. 1. The ACC algorithm 130 divides the input array x (110) into multiple segments (120A, 120B, 120C. etc.), then performs a series of computation operations on these segments: a windowing operation 210; a Fast Fourier Transform (FFT) operation 220; a complex conjugate operation 230; a multiplication operation 240; an addition operation 250; and a PSD operation 260.

As shown in FIG. 2, some operations involve a single segment, and other operations involve adjacent segments (e.g., 110A and 110B). Operations on a particular segment are time-dependent, since the result of one operation provides input to the next operation. For example, the windowing operation 210 feeds into the FFT operation 220. The multiplication operation 240 uses adjacent segments, and so is time-dependent on the previous operations on both segments. For example, the FFT operation 220 on segment 120A and the FFT operation 220 on segment 120B must complete before the multiplication operation 240 can begin. Within these constraints, parallel processing is possible.

One of the per-segment computations (performed in block 220) is an FFT, which transforms $N_{FFT}$ points in the time domain into $N_{FFT}$ points in the frequency domain. The ACC algorithm 130 uses a segment size equal to $N_{FFT}$, the number of FFT points. This choice of segment size results in an efficient FFT computation, but another segment size can be chosen. Fast Fourier Transforms will be familiar to one skilled in the art of digital signal processing, so the details of FFT computation will not be discussed in detail. Using a larger N in the FFT computation produces better resolution in the frequency domain, but at the cost of increased computational complexity. Thus, the value of N is a design choice that depends on the resolution desired and the computing resources available. In a preferred embodiment, N is a power of 2. In one embodiment, N is $2^{13}$.

In the example shown in FIG. 2, $N_{FFT}$ is 4, and the input array x (110) contains n segments, though only four are illustrated. The first segment, 120A, includes samples x[1]-x[4]. The second segment, 120B, includes samples x[5]-x[8]. The last segment, 120C, is segment x[n], and contains the last four samples.

The first per-segment computation performed by the ACC algorithm 130 (in block 210) applies a window to each segment (110A, 110B, 110C etc.). In this context, a window is a vector. To apply the window to a segment, each value in the segment array is multiplied by the corresponding value in the window. Put another way, the segment is scaled by the window. In the example embodiment of FIG. 2, a "rectangular" window is used. The rectangular window is used in this embodiment because it produces a narrow peak. A rectangular window also produces high side lobes. If side lobes are undesirable for a particular use or application, than another type of window (e.g., Hamming, Blackman, and Hann) can be used.

The output of windowing block 210 provides input to the FFT block 220. The FFT block 220 operates on the windowed time domain samples in a particular segment x (110A, 110B, 100C etc.) to produce an output array X (270) containing frequency domain samples. As stated earlier, the number of FFT points is specified as $N_{FFT}$. Thus, FFT block 220 performs the following computations in the example embodiment of FIG. 2:

$$X[1]=FFT(x[1], N_{FFT}); X[2]=FFT(x[2], N_{FFT}); X[3]=FFT(X[3], N) \ldots$$

The FFT produced by block 220 and stored in array X (280) provides input to the conjugate block 230 and the multiplication block 240. As can be seen in FIG. 2, block 230 operates on the "current" FFT, computing the complex conjugate of this FFT. Multiplication block 240 receives this complex conjugate and the "previous" FFT, and multiplies the two arrays. Thus, blocks 230 and 240 perform the following in the example embodiment of FIG. 2:

$$Y[1]=X[1] \times \text{conj}(X[2]); Y2=X[2] \times \text{conj}(X[3]); Y3=X[3] \times \text{conj}(X[4]); \ldots$$

The outputs of each instantiation of the multiplication block 240 are provided to an addition block 250. The addition block 250 sums, or integrates, these inputs. The result is an array of frequency domain samples of size N/2, with the frequencies spaced $F_s/N_{FFT}$ apart. The PSD block 130 computes the power spectral density of this array by multiplying the array by its complex conjugate. The result is PSD array 140, which contains the relative power at each frequency from 0 to $N_{FFT}/2$, typically expressed in dB units.

The ACC algorithm 130 improves on conventional tone detection techniques by using small FFT segment and coherently integrating adjacent segments. As a result, the ACC algorithm 130 has the desirable behavior of compensating for frequency drift, and producing a PSD array 140 with improved gain. Tones can be detected in the output of the ACC algorithm 130 by the PSD array 140 as input to a Constant False Alarm Rate (CFAR) detector (see FIG. 3), which produces a list of detected tones. The CFAR detector will not be discussed in further detail, since a person of ordinary skill in the art of signal processing will understand its use.

Figure 3:
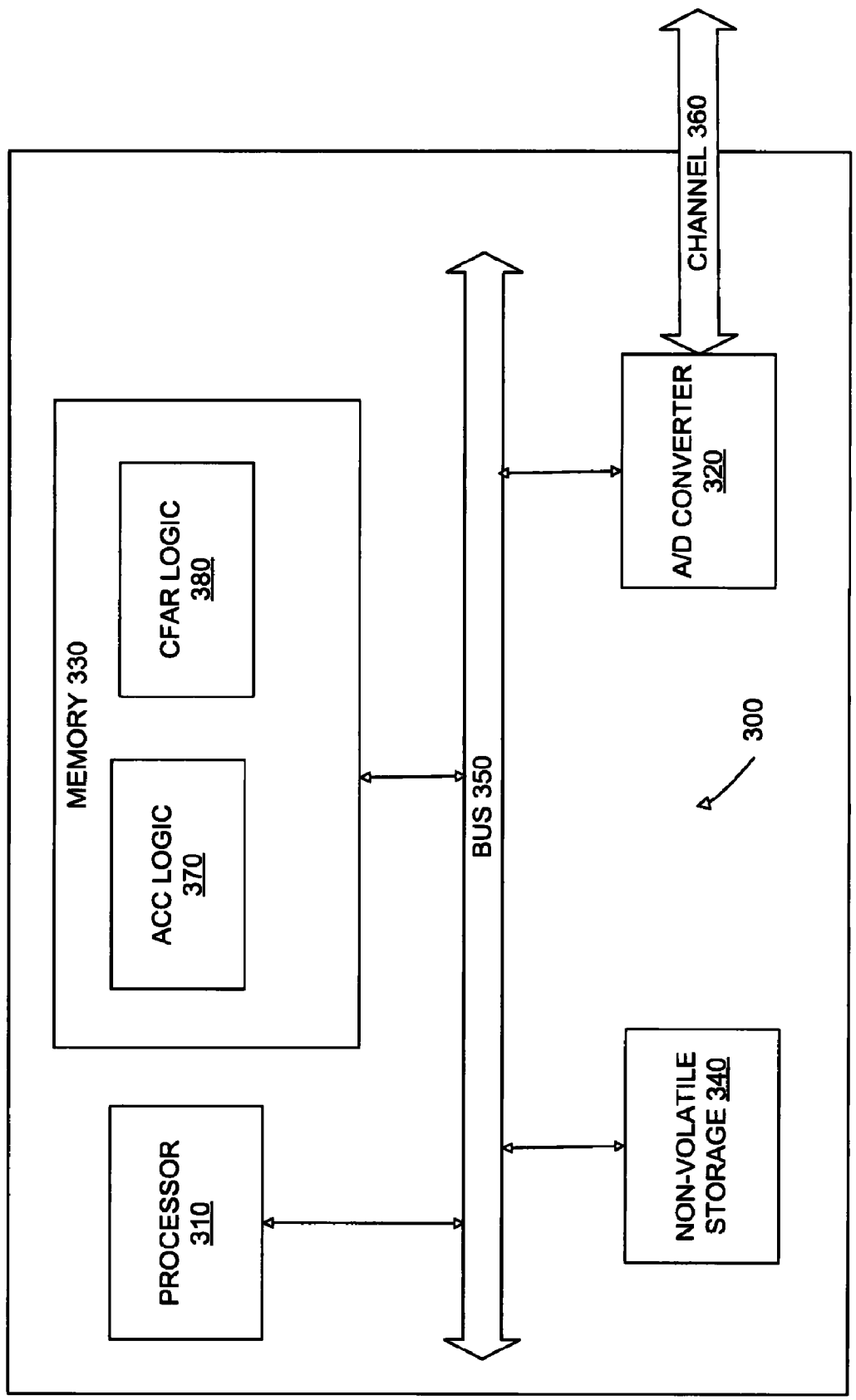
FIG. 3 is a hardware block diagram of an example device that implements the ACC algorithm 130 of FIGS. 1 and 2.

FIG. 3 is a hardware block diagram of an example device that implements the ACC algorithm 130 of FIGS. 1 and 2. The device contains a number of components that are well known in the art of ubiquitous computing, including a processor 310, an A/D converter 320, memory 330, and non-volatile storage 340. Examples of non-volatile storage include, for example, a hard disk, flash RAM, flash ROM, EEPROM, etc. These components are coupled via a bus 350.

A/D converter 320 receives a signal over channel 360. Memory 330 contains ACC logic 370 which, when executed on processor 310, implements the ACC algorithm 130 described herein. Memory 330 also contains CFAR detector logic 380, which is used in conjunction with the CC logic 370 as described above. In one embodiment, the ACC logic 370 operates on a signal received over channel 360. In another embodiment, the ACC logic 370 operates on a signal stored in non-volatile storage 340.

Omitted from FIG. 3 are a number of conventional components, known to those skilled in the art, that are not necessary to explain the operation of the system and method for detecting a weak signal in noisy environment.

The foregoing description has been presented for purposes of illustration and description. It is not intended to be exhaustive or to limit the invention to the precise forms disclosed. Obvious modifications or variations are possible in light of the above teachings. The embodiments discussed, however, were chosen and described to illustrate the principles of the invention and its practical application to thereby enable one of ordinary skill in the art to utilize the invention in various embodiments and with various modifications as are suited to the particular use contemplated. All such modifications and variation are within the scope of the invention as determined by the appended claims when interpreted in accordance with the breadth to which they are fairly and legally entitled.

What we claim is:

1. A system for computing a power spectrum density for a signal, the signal comprising a series of time domain samples, the system comprising
    memory having stored thereon program code; and
    a processor that is programmed by at least the program code to enable the device to:
        compute a first Fast Fourier Transform (FFT) of a first segment of the signal;
        compute a second FFT of a second segment of the signal, wherein the first and second segments are adjacent and non-overlapping in the time domain, and the second segment follows the first segment in time;
        multiply the first FFT by a complex conjugate of the second FFT to produce a first product;
        compute a first complex value of the first product;
        compute a third FFT of a third segment of the signal, wherein the second and third segments are adjacent and non-overlapping in the time domain, and the third segment follows the second segment in time;
        multiply the second FFT by a complex conjugate of the third FFT to produce a second product;
        compute a second complex value of the second product;
        add the first and second complex values to produce a sum; and
        compute the power spectral density of the sum.

2. The system of claim 1, wherein the processor is further programmed by the program code to:
    multiply the sum by the complex conjugate of the sum to produce the power spectral density.

3. The system of claim 1, wherein the processor is further programmed by the program code to:
    apply a window function to the first segment before computing the FFT of the first segment.

4. The system of claim 1, wherein the power spectral density is an array of power values indexed by frequency, and wherein the processor is further programmed by the program code to:
    compare each of the power values in the power spectral density array to a threshold; and
    if one of the power values exceeds the threshold, determine that a tone has been detected at the frequency associated with the power value that exceeds the threshold.

5. The system of claim 1, wherein the time domain samples are complex numbers.

* * * * *